(12) United States Patent
Southworth et al.

(10) Patent No.: US 11,632,856 B2
(45) Date of Patent: Apr. 18, 2023

(54) WALL FOR ISOLATION ENHANCEMENT

(71) Applicant: RAYTHEON COMPANY, Waltham, MA (US)

(72) Inventors: Andrew Southworth, Lowell, MA (US); Kevin Wilder, Derry, NH (US); James Benedict, Tewksbury, MA (US); Mary K. Herndon, Littleton, MA (US); Thomas V. Sikina, Acton, MA (US); John P. Haven, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 48 days.

(21) Appl. No.: 17/366,836

(22) Filed: Jul. 2, 2021

(65) Prior Publication Data

US 2021/0337651 A1    Oct. 28, 2021

Related U.S. Application Data

(62) Division of application No. 16/517,043, filed on Jul. 19, 2019, now Pat. No. 11,089,673.

(51) Int. Cl.
*H05K 1/02* (2006.01)
*H05K 1/11* (2006.01)
(Continued)

(52) U.S. Cl.
CPC ............... *H05K 1/023* (2013.01); *H01Q 1/38* (2013.01); *H01Q 1/526* (2013.01);
(Continued)

(58) Field of Classification Search
CPC . H05K 1/02; H05K 1/023; H05K 1/11; H05K 1/18; H05K 1/183; H05K 1/0216; H05K 3/30; H05K 3/31; H05K 3/0026; H05K 3/0043; H05K 3/242; H05K 3/284; H05K 5/00; H05K 5/06; H05K 9/00;
(Continued)

(56) References Cited

U.S. PATENT DOCUMENTS 5,150,282 A * 9/1992 Tomura ............... H04B 1/3833
361/736
6,131,269 A 10/2000 Lee et al.
(Continued)

FOREIGN PATENT DOCUMENTS

WO   2019058378 A1   3/2019
WO   2019094470 A1   5/2019

OTHER PUBLICATIONS

Written Opinion Application No. PCT/US2020/042303; dated Oct. 15, 2020; pp. 8.
(Continued)

*Primary Examiner* — Xiaoliang Chen
(74) *Attorney, Agent, or Firm* — Cantor Colburn LLP

(57) ABSTRACT

A circuit assembly is provided and includes a printed circuit board (PCB) having a circuit element region and defining a trench surrounding an entirety of the circuit element region, a circuit element disposed within the circuit element region of the PCB; and a Faraday wall. The Faraday wall includes a solid, unitary body having a same shape as the trench. The Faraday wall is disposed within the trench to surround an entirety of the circuit element.

7 Claims, 4 Drawing Sheets

(51) Int. Cl.

| | | |
|---|---|---|
| *H05K 1/18* | (2006.01) | |
| *H05K 3/26* | (2006.01) | |
| *H05K 3/30* | (2006.01) | |
| *H05K 5/00* | (2006.01) | |
| *H05K 5/06* | (2006.01) | |
| *H05K 9/00* | (2006.01) | |
| *H01L 23/34* | (2006.01) | |
| *H01L 23/498* | (2006.01) | |
| *H01L 23/552* | (2006.01) | |
| *H01Q 1/38* | (2006.01) | |
| *H01Q 1/52* | (2006.01) | |
| *H05K 3/00* | (2006.01) | |

(52) U.S. Cl.
CPC ......... *H05K 3/0026* (2013.01); *H05K 3/0044* (2013.01); *H05K 3/30* (2013.01); *H05K 2201/09036* (2013.01); *H05K 2201/10371* (2013.01)

(58) Field of Classification Search
CPC ......... H05K 9/0024; H05K 2201/0715; H05K 2201/09038; H05K 2201/09145; H05K 2201/09972; H05K 2201/10371; H01L 23/34; H01L 23/60; H01L 23/498; H01L 23/552; H01L 23/585; H01L 23/3672
USPC ......... 343/841; 174/262, 377; 361/709, 728, 361/736, 752, 760, 818
See application file for complete search history.

(56) References Cited

U.S. PATENT DOCUMENTS

| | | | | |
|---|---|---|---|---|
| 6,577,504 B1* | 6/2003 | Lofland | ............... | H01L 23/3672 174/16.3 |
| 8,849,362 B1* | 9/2014 | Saji | ................... | H05K 1/0218 257/659 |
| 10,631,405 B1 | 4/2020 | Benedict | | |
| 2002/0127843 A1* | 9/2002 | Noguchi | ........... | H01L 21/76826 257/E21.582 |
| 2011/0025553 A1* | 2/2011 | Cooke | .................... | H01Q 13/24 342/175 |
| 2012/0008288 A1* | 1/2012 | Tsukamoto | .......... | H05K 9/0037 361/736 |
| 2012/0015127 A1* | 1/2012 | Kurz | ..................... | H05K 9/0032 294/26 |
| 2012/0286393 A1 | 11/2012 | Lin | | |
| 2013/0000969 A1* | 1/2013 | Fang | .................... | H05K 9/0026 174/377 |
| 2013/0105952 A1* | 5/2013 | Fontana | ............... | H05K 9/0009 257/659 |
| 2014/0160699 A1* | 6/2014 | Zhang | .................... | H05K 13/00 427/523 |
| 2014/0302713 A1* | 10/2014 | Su | ....................... | H01R 12/7082 439/607.35 |
| 2015/0043172 A1* | 2/2015 | Mugiya | ................. | H05K 9/0045 361/728 |
| 2015/0049439 A1* | 2/2015 | Shimamura | ............. | H01L 24/97 361/728 |
| 2015/0070849 A1* | 3/2015 | Shimamura | .......... | H05K 1/0216 361/728 |
| 2015/0119102 A1* | 4/2015 | Saji | ..................... | H01L 23/5384 455/550.1 |
| 2016/0095217 A1* | 3/2016 | Kurauchi | ............... | H05K 3/242 174/261 |
| 2016/0095267 A1* | 3/2016 | Kitazaki | ............... | H05K 1/0216 361/760 |
| 2018/0092257 A1* | 3/2018 | Otsubo | ................ | H05K 9/0024 |
| 2019/0045674 A1* | 2/2019 | Liang | ..................... | H05K 1/181 |
| 2019/0148807 A1 | 5/2019 | Sikina | | |
| 2019/0148832 A1 | 5/2019 | Adams | | |
| 2019/0150271 A1 | 5/2019 | Azadzoi | | |
| 2019/0150296 A1 | 5/2019 | Southworth | | |
| 2019/0269007 A1 | 8/2019 | Sikina | | |
| 2019/0269021 A1 | 8/2019 | Nufio-Molina | | |
| 2019/0289758 A1* | 9/2019 | Furuya | .................. | H01L 25/18 |
| 2019/0304927 A1* | 10/2019 | Kim | ....................... | H01L 24/48 |
| 2019/0307029 A1* | 10/2019 | Hannan | ................ | H05K 9/0039 |
| 2019/0357363 A1 | 11/2019 | Sikina | | |
| 2020/0036735 A1 | 11/2020 | Benedict | | |
| 2021/0051805 A1 | 2/2021 | Pevzner | | |

OTHER PUBLICATIONS

International Search Report Application No. PCT/US2020/042303; dated Oct. 15, 2020; pp. 5.

* cited by examiner

WALL FOR ISOLATION ENHANCEMENT

DOMESTIC PRIORITY

This application is a Divisional Application of U.S. Non-Provisional application Ser. No. 16/517,043, filed Jul. 19, 2019, the contents of which are incorporated by reference herein in its entirety.

BACKGROUND

The present disclosure relates to an apparatus and methods for enhancing isolation of electronic devices and, in particular, to an apparatus and method for providing an advanced manufacturing technology (AMT) copper Faraday wall for microwave isolation enhancement.

Currently, electrical devices that are used for the generation, transmission and reception of certain signals, such as radio frequency (RF) signals, include multi-layer printed circuit boards (PCBs) on which circuits, such as microwave and millimeter wave circuit designs, are disposed. These electrical devices often include conductive vias, sequential laminations and blind vias that require processing which can be a major cost and performance driver.

Currently, PCB shielding techniques often employ the use of ground vias in which through-holes are drilled through the entire board and electroplated in order to create a fence that attenuates higher-order RF modes. In some cases, cavities or channels have been built into PCBs for subsequent electroplating. These techniques have typically involved creating gaps within the multi-layer PCBs and have unnecessary process steps.

SUMMARY

According to an aspect of the disclosure, a circuit assembly is provided and includes a printed circuit board (PCB) having a circuit element region and defining a trench surrounding an entirety of the circuit element region, a circuit element disposed within the circuit element region of the PCB; and a Faraday wall. The Faraday wall includes a solid, unitary body having a same shape as the trench. The Faraday wall is disposed within the trench to surround an entirety of the circuit element.

In accordance with additional or alternative embodiments, the circuit element includes one or more of a microwave circuit, an antenna and a radiator.

In accordance with additional or alternative embodiments, the PCB has multiple layers.

In accordance with additional or alternative embodiments, one or more of the multiple layers defines the trench and the Faraday wall traverses the one or more of the multiple layers within the trench.

In accordance with additional or alternative embodiments, the Faraday wall includes a conductive material.

In accordance with additional or alternative embodiments, the Faraday wall has a polygonal shape within a plane of the PCB.

In accordance with additional or alternative embodiments, the Faraday wall includes one or more of corners with complex geometrical shapes, chamfered corners and sides comprising inwardly protruding features.

In accordance with additional or alternative embodiments, the Faraday wall is one or more of soldered and press-fit into a secured position within the trench.

In accordance with additional or alternative embodiments, the trench is defined as multiple trenches surrounding an entirety of the antenna element region and the Faraday wall is provided as multiple Faraday walls respectively disposed within corresponding ones of the multiple trenches.

According to another aspect of the disclosure, a circuit assembly is provided and includes a multi-layer printed circuit board (PCB) having, in one or more layers thereof, a circuit/antenna/radiator element region and defining, in the one or more layers thereof, a trench surrounding an entirety of the circuit/antenna/radiator element region, a circuit/antenna/radiator element disposed within the circuit/antenna/radiator element region of the multi-layer PCB and a Faraday wall. The Faraday wall includes a solid, unitary body having a same shape as the trench and is disposed within the trench traversing the one or more layers to surround an entirety of the circuit/antenna/radiator element.

In accordance with additional or alternative embodiments, the Faraday wall includes a conductive material.

In accordance with additional or alternative embodiments, the Faraday wall has a polygonal shape within respective planes of the one or more layers of the multi-layer PCB.

In accordance with additional or alternative embodiments, the Faraday wall includes one or more of corners with complex geometrical shapes, chamfered corners and sides comprising inwardly protruding features.

In accordance with additional or alternative embodiments, the Faraday wall is one or more of soldered and press-fit into a secured position within the trench.

In accordance with additional or alternative embodiments, the multi-layer PCB defines, in the one or more layers thereof, the trench as multiple trenches surrounding an entirety of the circuit/antenna/radiator element region and the Faraday wall is provided as multiple Faraday walls respectively disposed within corresponding ones of the multiple trenches.

According to another aspect of the disclosure, a method of assembling a circuit assembly is provided and includes layering together a multi-layer printed circuit board (PCB) to have, in one or more layers thereof, an antenna element region and to define, in the one or more layers thereof, a trench surrounding an entirety of the antenna element region, disposing an antenna element within the antenna element region of the multi-layer PCB and disposing, within the trench, a Faraday wall comprising a solid, unitary body having a same shape as the trench such that the Faraday wall traverses the one or more layers to surround an entirety of the antenna element.

In accordance with additional or alternative embodiments, the layering together of the multi-layer printed circuit board (PCB) includes one or more of milling and lazing the multi-layer PCB to define, in the one or more layers thereof, the trench In accordance with additional or alternative embodiments, the one or more of the milling and the lazing includes one or more of milling and lazing the multi-layer PCB from an uppermost layer to a desired depth.

In accordance with additional or alternative embodiments, the method further includes one or more of automated cutting, machining, stamping and extruding of the Faraday wall.

In accordance with additional or alternative embodiments, the disposing of the Faraday wall within the trench includes one or more of soldering and press-fitting the Faraday wall into a secured position within the trench.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a circuit assembly is provided with a Faraday wall or, more particularly, a copper Faraday wall. The Faraday wall is a solid, unitary insert feature that is soldered or press-fit into a trench, which is milled or lazed into a printed circuit board (PCB). As opposed to vias, where material is removed and then plated, the Faraday wall insert feature is readily installed in place without chemical processing. The Faraday wall thus forms a barrier which isolates adjacent microwave circuits from one another, acts as a tuning element in a radiator system (e.g., in a low profile array radiator where the Faraday wall can enable the creation of two narrow bands with acceptable performance at an X-band) and/or provides for electrical mode suppression without electroplating. Moreover, while via fences tend to leak at high frequencies, Faraday walls avoid leakage by forming a continuous wall of material.

Figure 1:
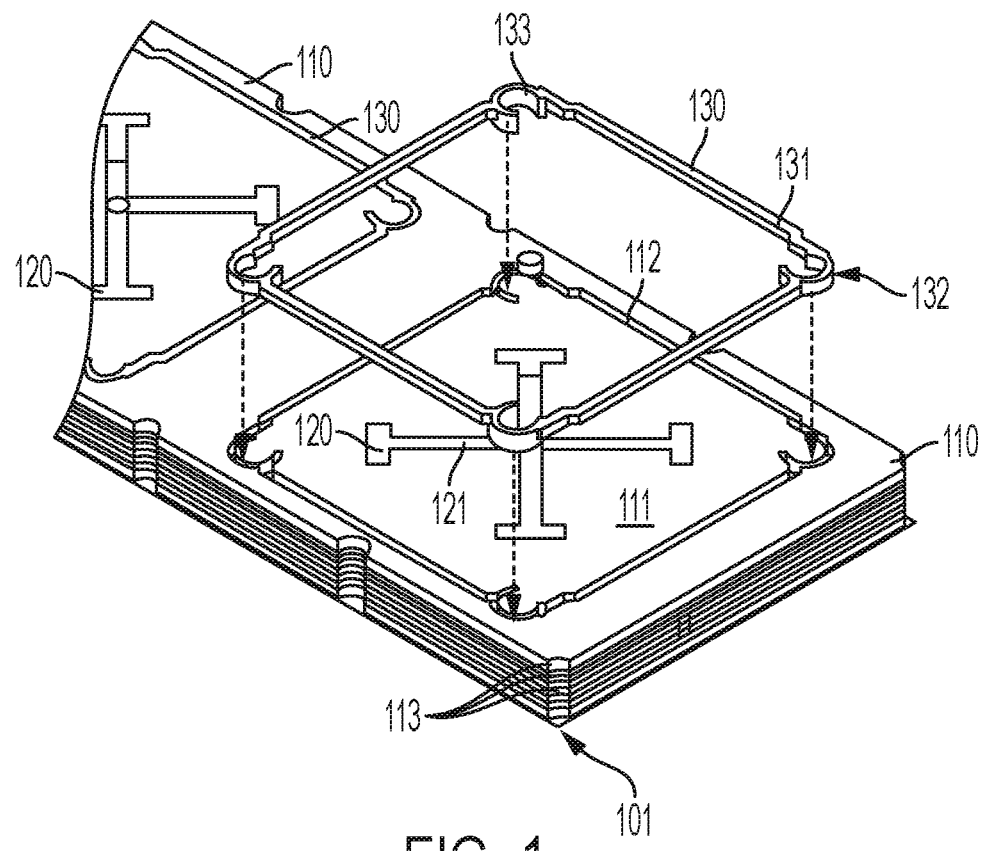
FIG. 1 is a perspective view of a circuit assembly with a Faraday wall in accordance with embodiments.
Figure 2:
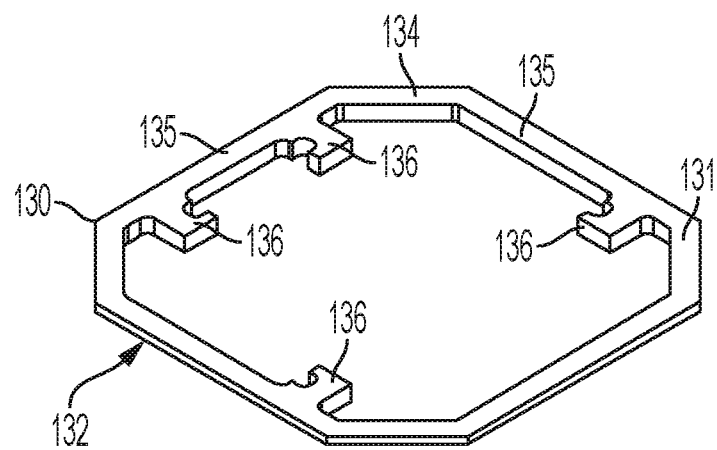
FIG. 2 is a perspective view of a Faraday wall in accordance with alternative embodiments.
Figure 3:
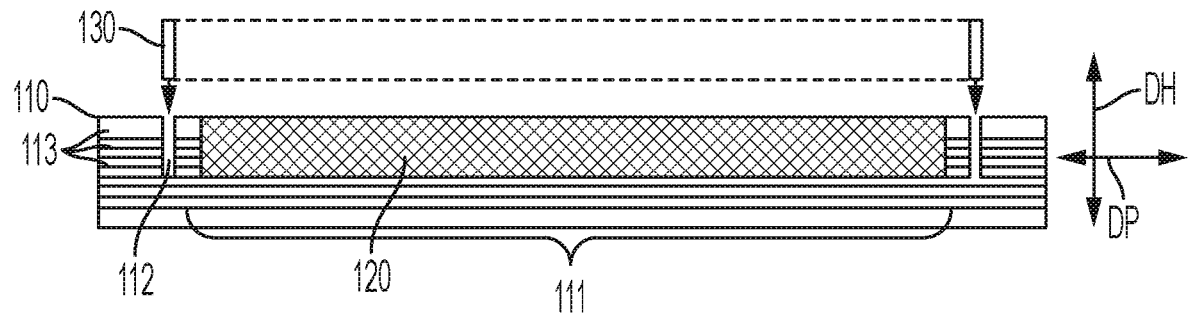
FIG. 3 is a side view of a circuit assembly with a Faraday wall in accordance with embodiments.

With reference to FIGS. 1-3, a circuit assembly 101 is provided and includes a printed circuit board (PCB) 110, a circuit element 120 and a Faraday wall 130. While these features are illustrated in FIG. 1 as being part of a processing yield that can be broken up into multiple devices following fabrication, it is to be understood that this is not necessary and that the circuit assembly 101 can be fabricated on an individualized basis as well.

The PCB 110 has a circuit element region 111 defined in a central portion thereof and is formed to define a trench 112. The trench 112 is continuous and surrounds an entirety of the circuit element region 111. The circuit element 120 is disposed within the circuit element region 111 of the PCB 110 and can be provided as one or more of a microwave circuit, an antenna and a radiator (i.e., a circuit/antenna/radiator element) 121. The Faraday wall 130 can include a conductive material, such as copper or another suitable metal or metallic alloy, and includes a solid, unitary body 131 that has a same shape as the trench 112 to thus fit tightly within the trench 112. The Faraday wall 130 is disposed within the trench 112 and is continuous to surround an entirety of the circuit element 120.

As shown in FIGS. 1 and 3, the PCB 110 has multiple layers 113. In these or other cases, one or more of the multiple layers 113 defines the trench 112 and the Faraday wall 130 traverses the one or more of the multiple layers 113 in the height-wise dimension DH (see FIG. 3) when the Faraday wall 130 is disposed within the trench 112. In an exemplary case, the trench 112 can be defined by the uppermost ones of the multiple layers 113. Here, a thickness or depth of the trench 112 can be equal to or less than the combined thicknesses of the uppermost ones of the multiple layers 113 defining the trench 112 and can be equal to or greater than the thickness or height of the Faraday wall 130.

Although the details of FIG. 3 suggest that the depths of the trench 112 and that the height of the Faraday wall 130 in the height-wise dimension DH exceeds the thickness of the circuit element 120, it is to be understood that this is not required and that other embodiments exist in which this is not the case. For example, the depths of the trench 112 and that the height of the Faraday wall 130 in the height-wise dimension DH might not exceed the thickness of the circuit element 120 as long as electromagnetic radiation leaking from the circuit element 120 in the planar dimension DP is substantially blocked by the Faraday wall 130.

As shown in FIGS. 1 and 2, the Faraday wall 130 can have a polygonal shape 132 within a plane of the PCB 110 and can include one or more of corners with complex geometrical shapes 133 (see FIG. 1), chamfered corners 134 (see FIG. 2) and sides 135 that include inwardly protruding features 136 (see FIG. 2). As a general matter, the particular shape and combination of features of the Faraday wall 130 can be a function of a type, a configuration and an operation of the circuit element 120. For example, in the embodiment of FIG. 1 in which the circuit element 120 is a microwave circuit with a Jerusalem cross configuration, the Faraday wall 130 can have the corners with complex geometrical shapes 133 (e.g., clockwise or counter-clockwise facing C-shaped features). As another example, as in the embodiment of FIG. 2, the Faraday wall 130 can have the chamfered corners 134 and the sides 135 that include inwardly protruding features 136 in order to accommodate certain electrical structures such as coaxial cabling and other similar features (e.g., coaxial transverse electromagnetic (TEM) circuit features).

In any case, as shown in FIG. 3, the trench 112 and the Faraday wall 130 are both configured such that the Faraday wall 130 fits tightly within the trench 112. Thus, insertion and installation of the Faraday wall 130 into the trench 112 can be executed by way of a combination of one or more of soldering and press-fitting of the Faraday wall 130 into the trench 112.

To whatever extent the Faraday wall 130 does not fit tightly within the trench 112, it is to be understood that the Faraday wall 130 can be machined or discarded and replaced. In either case, the PCB 110 is not affected as it would otherwise be in an electroplating case.

Figure 4:
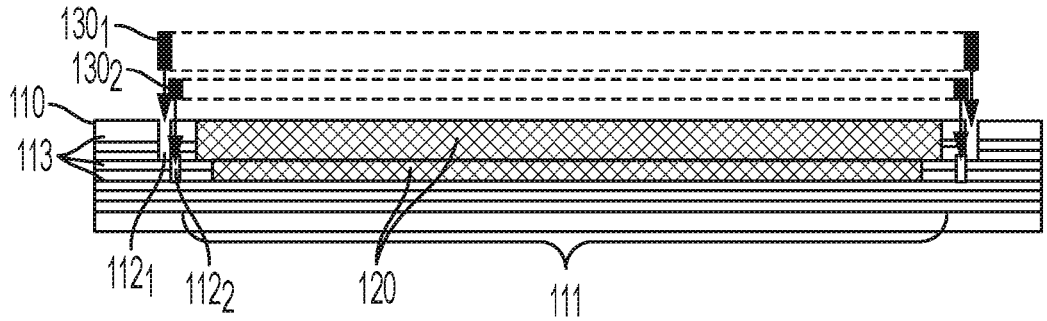
FIG. 4 is a side view of a circuit assembly with a Faraday wall in accordance with further embodiments.

With reference to FIG. 4, the trench 112 can be defined as multiple trenches $112_1$ and $112_2$ that cooperatively surround the entirety of the antenna element region 111. In these or other cases, the Faraday wall 130 can be provided as multiple Faraday walls $130_1$ and $130_2$ that are respectively disposed within corresponding ones of the multiple trenches $112_1$ and $112_2$.

Figure 5:
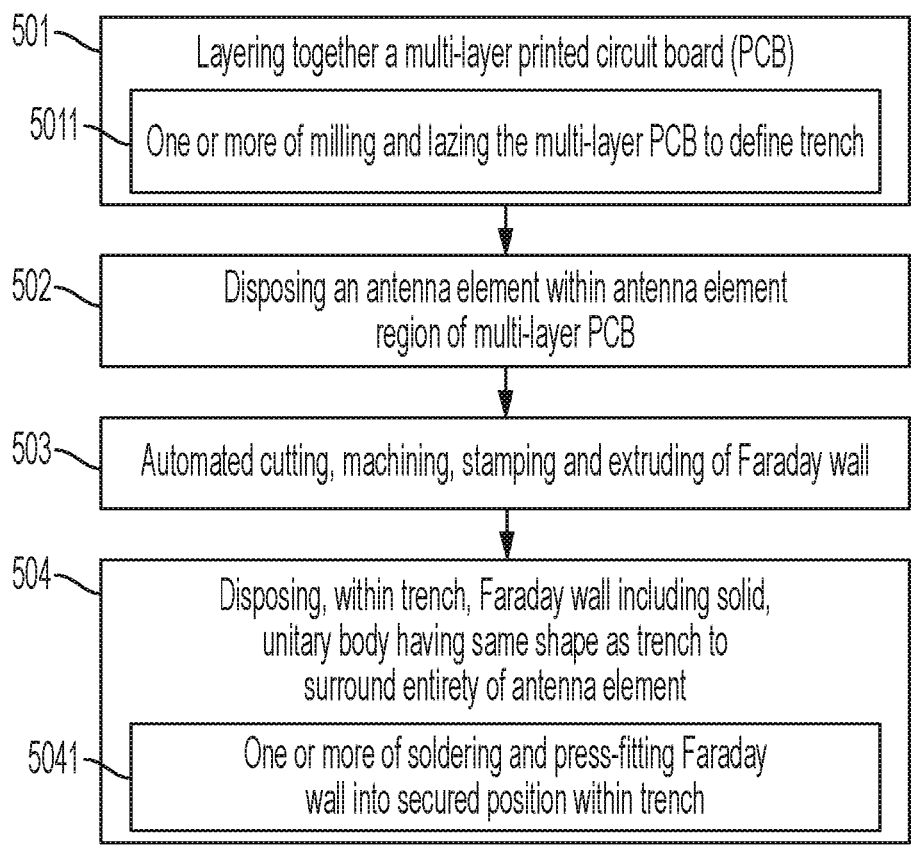
FIG. 5 is a flow diagram illustrating a method of assembling a circuit assembly in accordance with embodiments.

With reference to FIG. 5, a method of assembling a circuit assembly is provided. As shown in FIG. 5, the method includes layering together a multi-layer PCB to have, in one or more layers thereof, an antenna element region and to define, in the one or more layers thereof, a trench surrounding an entirety of the antenna element region 501, disposing an antenna element within the antenna element region of the multi-layer PCB 502, automated cutting, machining, stamping and extruding of a Faraday wall 503 and disposing, within the trench, the Faraday wall where the Faraday wall includes a solid, unitary body having a same shape as the trench such that the Faraday wall traverses the one or more layers to surround an entirety of the antenna element 504.

In accordance with embodiments, the layering together of the multi-layer PCB of operation 501 can include one or more of milling and lazing the multi-layer PCB to define, in the one or more layers thereof, the trench 5011 and the one or more of the milling and the lazing of operation 5011 can include one or more of milling and lazing the multi-layer PCB from an uppermost layer to a desired depth. In addition, the disposing of the Faraday wall within the trench of operation 504 can include one or more of soldering and press-fitting the Faraday wall into a secured position within the trench 5041.

With reference to FIGS. 6A-6E, the method described above with reference to FIG. 5 will be described in further detail.

Figure 6A:
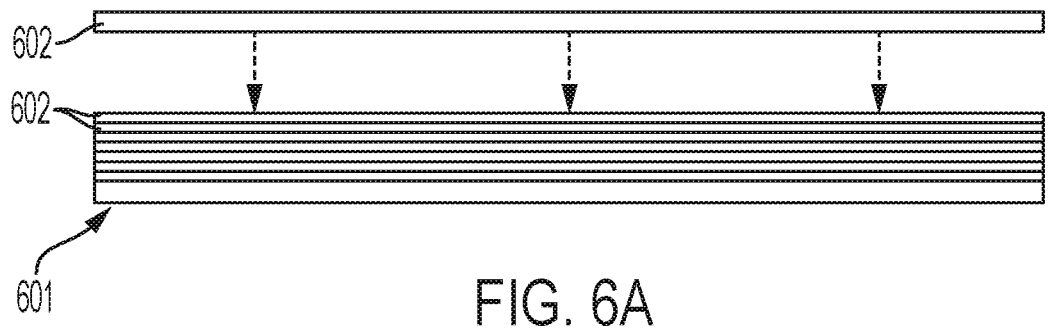
FIGS. 6A-6E illustrate the method of FIG. 5 in accordance with embodiments.
Figure 6B:
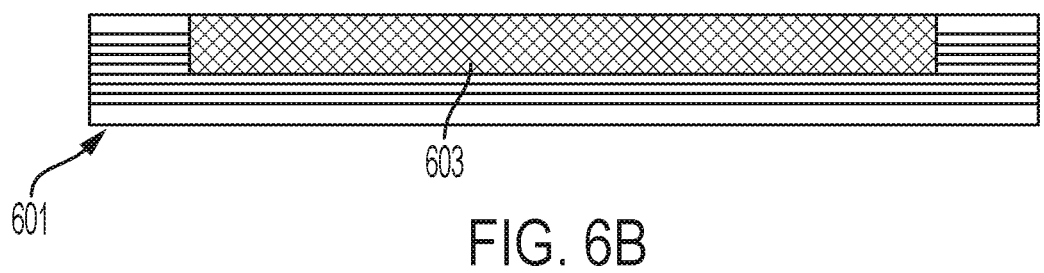

As shown in FIG. 6A, a multi-layer PCB 601 is assembled or layered with multiple layers 602 having various thicknesses according to various layering or laminating processes and, once the multi-layer PCB 601 is assembled, a circuit/antenna/radiator element 603 is installed in a circuit/antenna radiator element region as shown in FIG. 6B.

While FIGS. 6A and 6B suggest that the multi-layer PCB 601 is assembled prior to the installation of the circuit/antenna/radiator element 603, it is to be understood that this is not required and that embodiments exist in which the circuit/antenna/radiator element 603 is built into the multiple layers 602 during the layering or laminating processes.

Figure 6C:
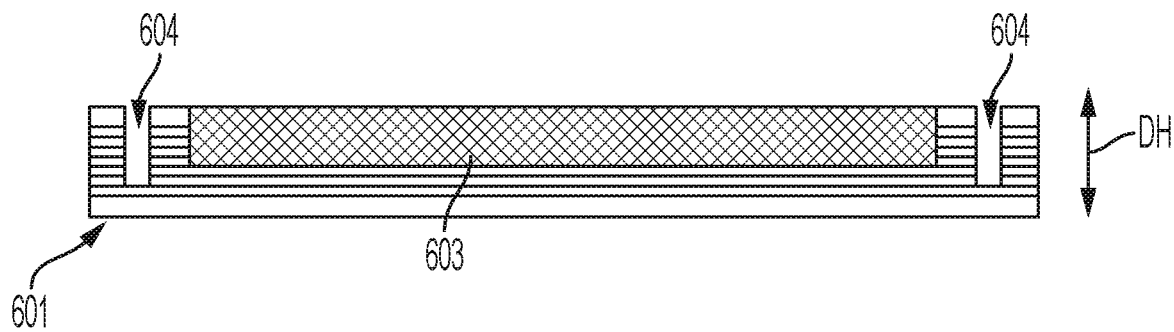

As shown in FIG. 6C, a trench 604 is defined in the multi-layer PCB 601. The trench 604 extends continuously around the circuit/antenna/radiator element 603. The trench 604 has a depth in the height-wise dimension DH that is equal to or greater than the thickness of the circuit/antenna/radiator element 603 although it is to be understood that this is not required and that embodiments exist in which the trench 604 has a depth that is lesser than the thickness of the circuit/antenna/radiator element 603.

In accordance with embodiments, the trench 604 can be defined by one or more of milling and lazing of the multi-layer PCB 601 from an uppermost one of the multiple layers 602, through a next uppermost one of the multiple layers 602, and so on.

Figure 6D:
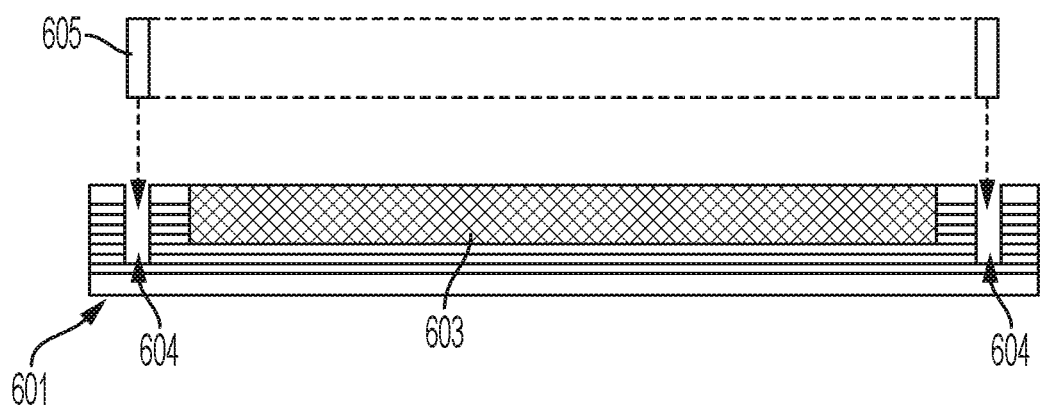
Figure 6E:
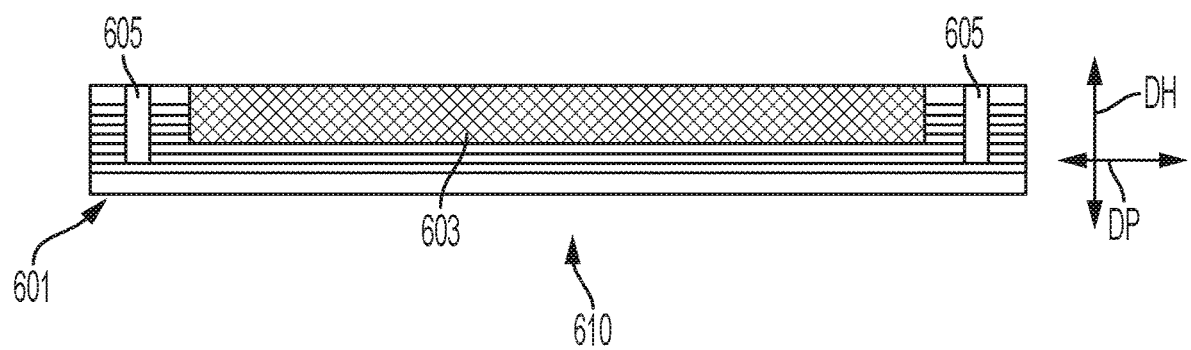

As shown in FIGS. 6D and 6E, Faraday wall 605 is formed by one or more of automated cutting, machining, stamping and extruding processes to tightly fit into the trench 604 (see FIG. 6D) and the Faraday wall 605 is subsequently installed within the trench 604 by one of soldering and press-fitting (see FIG. 6E). The resulting circuit assembly 610, which has been assembled without the need for electroplating or other chemical processing, is configured such that electromagnetic radiation leaking from the circuit/antenna/radiator element 603 in the planar dimension DP is block by the continuous body of the Faraday wall 605. That is, the Faraday wall 605 provides for electrical mode suppression without the need for electroplating techniques being executed.

As such, to the extent that the circuit/antenna/radiator element 603 is a microwave circuit adjacent to another microwave circuit, the Faraday wall 605 forms a barrier which isolates the adjacent microwave circuits from one another. To the extent that the circuit/antenna/radiator element 603 is a radiator element, the Faraday wall 605 can act as a tuning elements in an overall radiator system (e.g., a low profile array radiator) in which the Faraday wall 605 enables the creation of two narrow bands with acceptable performance at an X-band.

Technical effects and benefits of the present invention are the provision of a circuit assembly with a Faraday wall or, more particularly, a copper Faraday wall that offers a shielding alternative to a via fence and can be assembled using low-cost, high volume fabrication methods that are chemical process free.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A circuit assembly, comprising:
    a printed circuit board (PCB) having a circuit element region and defining a trench surrounding an entirety of the circuit element region;
    a circuit element disposed within the circuit element region of the PCB; and
    a Faraday wall comprising a solid, unitary body having a same shape as the trench and being disposed within the trench to surround an entirety of the circuit element,
    wherein the Faraday wall has a polygonal shape within a plane of the PCB and comprises one or more of corners with complex geometrical shapes, chamfered corners and sides comprising inwardly protruding features.

2. The circuit assembly according to claim 1, wherein the circuit element comprises one or more of a microwave circuit, an antenna and a radiator.

3. The circuit assembly according to claim 1, wherein the PCB has multiple layers.

4. The circuit assembly according to claim 1, wherein one or more of the multiple layers defines the trench and the Faraday wall traverses the one or more of the multiple layers within the trench.

5. The circuit assembly according to claim 1, wherein the Faraday wall comprises a conductive material.

6. The circuit assembly according to claim 1, wherein the Faraday wall is one or more of soldered and press-fit into a secured position within the trench.

7. The circuit assembly according to claim 1, wherein:
    the trench is defined as multiple trenches surrounding an entirety of the circuit element region, and the Faraday wall is provided as multiple Faraday walls respectively disposed within corresponding ones of the multiple trenches.

\* \* \* \* \*